(12) United States Patent
Kwon et al.

(10) Patent No.: US 9,337,198 B2
(45) Date of Patent: May 10, 2016

(54) SEMICONDUCTOR DEVICE AND METHOD OF MANUFACTURING THE SAME

(71) Applicant: SK hynix Inc., Icheon-si (KR)

(72) Inventors: Oh Chul Kwon, Seongnam-si (KR); Ki Hong Lee, Suwon-si (KR); Seung Ho Pyi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 13/735,761

(22) Filed: Jan. 7, 2013

(65) Prior Publication Data

US 2014/0061750 A1 Mar. 6, 2014

(30) Foreign Application Priority Data

Aug. 31, 2012 (KR) .................. 10-2012-0096464

(51) Int. Cl.
*H01L 29/76* (2006.01)
*H01L 29/762* (2006.01)
*H01L 21/336* (2006.01)
*H01L 27/105* (2006.01)
*H01L 27/115* (2006.01)
*G11C 5/02* (2006.01)
*H01L 27/06* (2006.01)
*G11C 5/06* (2006.01)

(52) U.S. Cl.
CPC ............ *H01L 27/1052* (2013.01); *G11C 5/025* (2013.01); *G11C 5/063* (2013.01); *H01L 27/0688* (2013.01); *H01L 27/11526* (2013.01); *H01L 27/11529* (2013.01); *H01L 27/11531* (2013.01); *H01L 27/11556* (2013.01); *H01L 27/11573* (2013.01); *H01L 27/11582* (2013.01)

(58) Field of Classification Search
CPC ............... H01L 27/11526; H01L 27/11529; H01L 27/11531; H01L 27/11548; H01L 27/11573; H01L 27/11575; H01L 27/11578; H01L 27/11582; H01L 27/11556; H01L 27/0688; G11C 5/025
USPC ............... 257/314, 324, 326, 331, E29.309, 257/E21.423, E21.679; 438/257, 261
See application file for complete search history.

(56) References Cited

U.S. PATENT DOCUMENTS

| | | | |
|---|---|---|---|
| 6,753,239 B1 | 6/2004 | Conn | |
| 2002/0025604 A1* | 2/2002 | Tiwari | 438/118 |
| 2009/0108318 A1* | 4/2009 | Yoon et al. | 257/306 |
| 2009/0121271 A1* | 5/2009 | Son et al. | 257/315 |
| 2009/0141547 A1* | 6/2009 | Jin et al. | 365/163 |
| 2010/0327453 A1* | 12/2010 | Kim | 257/773 |
| 2011/0169072 A1* | 7/2011 | Lim et al. | 257/329 |
| 2011/0291176 A1* | 12/2011 | Lee et al. | 257/324 |
| 2011/0309431 A1* | 12/2011 | Kidoh et al. | 257/324 |
| 2012/0032250 A1* | 2/2012 | Son et al. | 257/324 |
| 2012/0273865 A1* | 11/2012 | Lee et al. | 257/316 |

* cited by examiner

*Primary Examiner* — Fernando L Toledo
*Assistant Examiner* — Aaron Gray
(74) *Attorney, Agent, or Firm* — Kilpatrick Townsend & Stockton LLP

(57) ABSTRACT

A semiconductor memory device includes a first substrate on which a cell region is defined. In the cell region, memory cells are stacked. A second substrate is located above the first substrate, and a peripheral region is defined on the second substrate. One or more conductive lines are located in the peripheral region. The one or more lines extend through the second substrate and couple to the cell region.

17 Claims, 18 Drawing Sheets

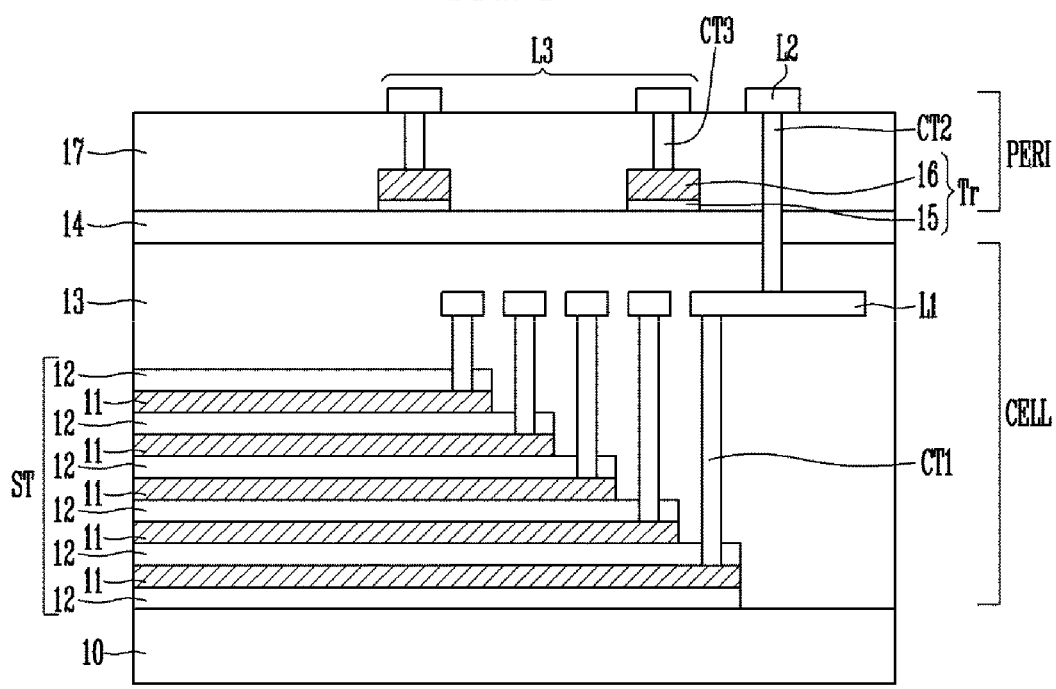

SEMICONDUCTOR DEVICE AND METHOD OF MANUFACTURING THE SAME

CROSS-REFERENCE TO RELATED APPLICATION

The present application claims priority to Korean patent application number 10-2012-0096464 filed on Aug. 31, 2012, in the Korean Intellectual Property Office, the entire disclosure of which is incorporated by reference herein.

BACKGROUND

1. Technical Field

Various embodiments relate generally to a semiconductor device and a method of manufacturing the same and, more particularly, to a semiconductor device including a stacked body and a method of manufacturing the same.

2. Related Art

A non-volatile memory device retains data stored therein even when not powered. Two-dimensional memory devices in which memory cells are fabricated in a single layer over a substrate have reached physical limits in increasing their degree of integration. Accordingly, three-dimensional (3D) non-volatile memory devices in which memory cells are stacked in a vertical direction over a substrate have been proposed.

A 3D non-volatile memory device includes a cell region where memory cells are stacked and a peripheral region outside the cell region where circuitry configured to interface with the memory cells is formed. In other words, since the cell region and the peripheral region are defined on a single substrate, the 3D non-volatile memory device is limited in increasing its integration degree.

BRIEF SUMMARY

An embodiment of the present invention relates to a semiconductor device with increased degree of integration and a method of manufacturing the same.

A semiconductor memory device according to an embodiment of the present invention may include a first substrate on which a cell region is defined. The cell region includes memory cells that are stacked. A second substrate is located above the first substrate. A peripheral region is defined on the second substrate. The peripheral region includes conductive lines that extend through the second substrate and are coupled to the cell region.

A semiconductor device according to another embodiment of the present invention may include a first substrate that in turn includes a cell region defined on a rear surface thereof and a peripheral region defined on a top surface thereof. A second substrate is formed under the cell region. The peripheral region includes one or more conductive lines that extend through the first substrate and are coupled to the cell region.

A method of manufacturing a semiconductor device according to yet another embodiment of the present invention may include forming at least one stacked structure on a first substrate; forming a first interlayer insulating layer on the first substrate on which the at least one stacked structure is formed; forming a second substrate on the first interlayer insulating layer; and forming at least one transistor on the second substrate.

A method of manufacturing a semiconductor device according to still another embodiment of the present invention may include forming at least one stacked structure on a first surface of a first substrate; forming a first interlayer insulating layer on the first surface of the first substrate on which the at least one stacked structure is formed; forming a second substrate on the first interlayer insulating layer; forming at least one transistor on a second surface of the first substrate; and forming a second interlayer insulating layer on the second surface of the first substrate on which the at least one transistor is formed.

BRIEF DESCRIPTION OF THE DRAWINGS

FIG. 1 is a cross-sectional view of a structure of a semiconductor device according to a first embodiment of the present invention;

DETAILED DESCRIPTION

Figure 2A:
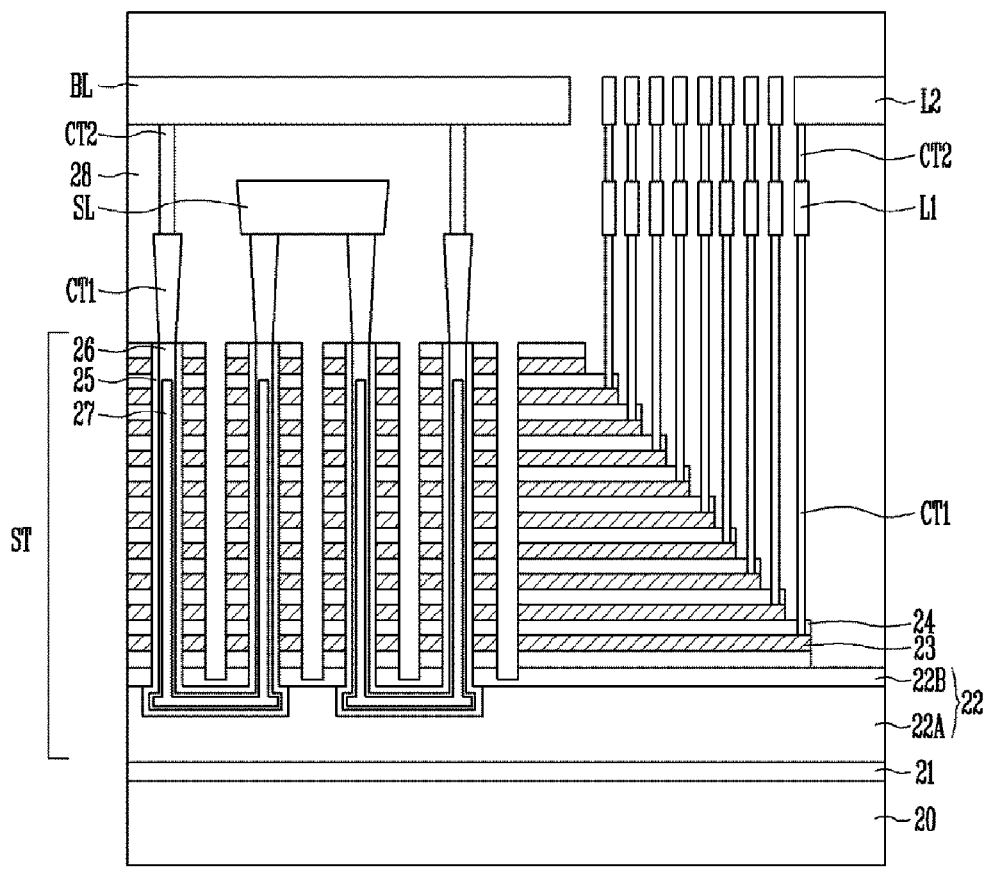
FIGS. 2A to 2D are cross-sectional views illustrating a process flow exemplifying a method of manufacturing a semiconductor device according to the first embodiment of the present invention.

Hereinafter, various embodiments of the present disclosure will be described in detail with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

It should be readily understood that the meaning of "on" and "over" in the present disclosure should be interpreted in the broadest manner such that "on" not only means "directly on" something but also includes the meaning of "on" something with an intermediate feature or a layer therebetween, and that "over" not only means the meaning of "over" something but may also include the meaning it is "over" something with no intermediate feature or layer therebetween (i.e., directly on something).

FIG. 1 is a cross-sectional view of a structure of a semiconductor device according a first embodiment of the present invention.

As illustrated in FIG. 1, the semiconductor device according to the first embodiment includes a first substrate 10, a second substrate 14 located over the first substrate 10, and at least one line, e.g., a second line L2. A cell region CELL in which memory cells are stacked is defined on the first substrate 10. A peripheral region PERI is defined on the second substrate 14. The second line L2 is located in the peripheral region PERI. The second line L2 passes through the second substrate 14 and is coupled to the cell region CELL. As can be seen, the first substrate 10 and the second substrate 14 are non-contiguous and are positioned along different planes.

The cell region CELL refers to a region where the memory cells are formed. The peripheral region PERI refers to a region where transistors configured to provide access to the memory cells are formed.

In addition, the semiconductor device may further include a stacked structure ST, a first interlayer insulating layer 13, one or more transistors Tr and a second interlayer insulating layer 17. The stacked structure ST is formed on the first substrate 10 and includes one or more first material layers 11 and one or more second material layers 12 that are alternately stacked. The first interlayer insulating layer 13 covers the stacked structure ST and is formed between the first substrate 10 and the second substrate 14. The transistors Tr are formed on the second substrate 14. The second interlayer insulating layer 17 is formed on the second substrate 14 and covers the transistors Tr.

Each first material layers 11 may be a conductive layer such as a polysilicon layer or a tungsten layer, or a semiconductor layer. Each second material layer 12 may be an insulating layer such as an oxide layer. In addition, the stacked structure ST may have a stepped sidewall as shown in FIG. 1. In this case, a contact region is defined along the stepped sidewall. Though not illustrated in FIG. 1, the semiconductor device may further include at least one pillar that vertically extends through the stacked structure ST. The pillar may be formed of a semiconductor layer or a conductive layer.

Each transistor Tr includes a gate insulating layer 15 formed on the second substrate 14 and a gate electrode 16 formed on the gate insulating layer 15.

The semiconductor device may further include first contact plugs CT1 and first lines L1. Each of the first contact plugs CT1 is coupled to a corresponding one of the first material layers 11 in the contact region of the stacked structure ST. In addition, the first lines L1 are coupled to the stacked structure ST through the first contact plugs CT1 and are located under the second substrate 14.

The semiconductor device may further include second contact plugs CT2 and second lines L2. The second contact plugs CT2 extend through the second substrate 14 and are coupled to the first lines L1. In addition, the second lines L2 are coupled to the first lines L1 through the second contact plugs CT2 and are located above the second substrate 14.

The semiconductor device may further include third contact plugs CT3 and third lines L3. Each of the third contact plugs CT3 is coupled to a corresponding one of the gate electrodes 16 of the transistors Tr. In addition, the third lines L3 are coupled to the transistors Tr through the third contact plugs CT3 and are located above the second substrate 14.

According to the above-described configuration, the second substrate 14 on which the peripheral region PERI is defined is located above the first substrate 10 on which the cell region CELL is defined, thereby achieving a high degree of integration.

FIGS. 2A to 2D are cross-sectional views illustrating a process flow exemplifying a method of manufacturing the semiconductor device according to the first embodiment of the present invention.

As illustrated in FIG. 2A, a stacked structure ST is formed over a first substrate 20. For example, in FIG. 2A, the stacked structure ST may include channel layers 26 having a U shape. The stacked structure ST includes a pipe gate 22, one or more first material layers 23, one or more second material layers 24, the U-shaped channel layers 26, and memory layers 25 surrounding channel layers 26. The pipe gate 22 is formed over the first substrate 20 with an insulating layer 21 interposed therebetween. The first material layers 23 and the second material layers 24 are alternately stacked over the pipe gate 22. The channel layers 26 include laterally extending pipe channel layers that are formed in the pipe gate 22, and source side and drain side channel layers that are coupled to the pipe channel layers and extend through the first and second material layers 23 and 24. The channel layers 26 may comprise silicon material, and may form the channel regions of select transistors located at the upper ends of the U-shaped channel layers 26, as well as the channel regions of the vertically stacked memory cells associated with each U-shaped channel layer 26.

The first material layers 23 comprise conductive layers, and the second material layers 24 comprise insulating layers. In addition, at least one of the uppermost first material layers 23 may be configured as a drain or source selection line, and the rest of the first material layers 23 may be configured as word lines.

In an alternate embodiment, a central region of each channel layer 26 may be filled with an insulating layer 27. A first conductive layer 22A configured as a pipe gate surrounds bottoms and sides of the pipe channel layers. A first conductive layer 22B configured as a pipe gate may surround top surfaces of the pipe channel layers. As shown in FIG. 2A, an insulation-filled slit may be formed between the vertical legs of each U-shaped channel layer 26. These insulation-filled slits may vertically extend through the first and second material layers 23 and 24, and terminate in the first conductive layer 22B. According to this structure, a plurality of U-shaped memory strings may be formed, each including at least one drain selection transistor located near an upper end of the U-shaped channel layer 26, a plurality of vertically stacked memory cells, and at least one source selection transistor located near an upper end of the U-shaped channel layer 26 opposite from the drain selection transistor.

In addition, the stacked structure ST may have a stepped sidewall. In this case, the first material layers 23 are exposed along the stepped sidewall, and a contact region is thus defined along the stepped sidewall of the stacked structure ST.

A first portion of a first interlayer insulating layer 28 is formed over the entire structure including the stacked structure ST. The first portion of the first interlayer insulating layer 28 is etched to form first contact holes through which the channel layers 26 and the first material layers 23 are exposed. The first contact holes are filled with conductive layers to form first contact plugs CT1.

Subsequently, first lines L1 are formed such that the first lines L1 may be coupled to the first contact plugs CT1. At the same time, a source line SL may also be formed. The source line SL may be coupled to the source side of the channel layers 26.

A second portion of the first interlayer insulating layer 28 is formed, and the second portion of the first interlayer insulating layer 28 is etched to form second contact holes through which the first lines L1 and/or the first contact plugs CT1 are exposed. After second contact holes are filled with conductive layers to form second contact plugs CT2, second lines L2 are formed such that the second lines L2 may be coupled to the second contact plugs CT2. Here, bit lines BL may also be formed at the same time. The bit lines BL are coupled to the drain side of the channel layers 26 through the first and second contact plugs CT1 and CT2. Subsequently, a third portion of the first interlayer insulating layer 28 is formed over the entire resultant structure.

Figure 2B:
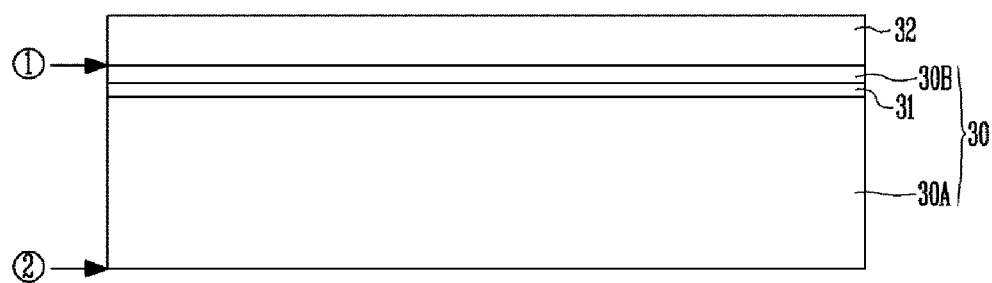

As illustrated in FIG. 2B, impurities are implanted into a first surface ① of a second substrate 30 to form an impurity layer 31. For example, hydrogen ions may be implanted into the second substrate 30 by using an ion implantation process so that the impurity layer 31 may be formed at a predetermined depth from a surface thereof.

The second substrate 30 is thus divided into an upper part 30B and a lower part 30A by the impurity layer 31. The upper part 30B on the impurity layer 31 is configured as a channel layer of a transistor formed in subsequent processes. Therefore, the position of the impurity layer 31 is determined in accordance with a target thickness of the channel layer. For example, the impurity layer 31 may be formed at a desired depth by determining a projected range (Rp) of impurities by controlling ion implantation energy and ion density.

Subsequently, a second interlayer insulating layer 32 is formed on the first surface ① of the second substrate 30. The second interlayer insulating layer 32 may comprise an insulating layer such as an oxide layer.

Figure 2C:
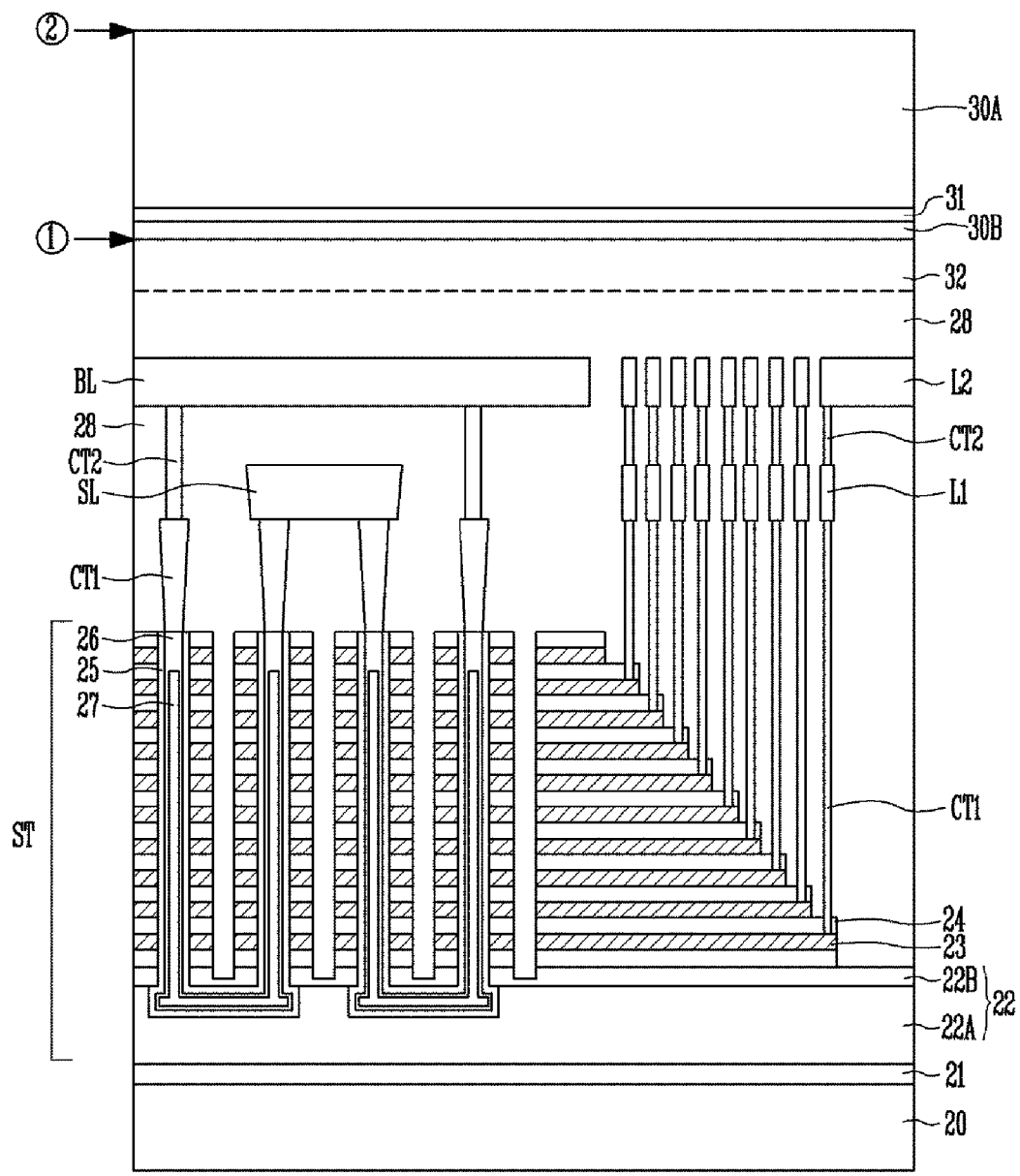

As illustrated in FIG. 2C, a top surface of the first interlayer insulating layer 28 of the structure in FIG. 2A is bonded to a top surface of the second interlayer insulating layer 32 of the structure in FIG. 2B. For example, the top surface of the first interlayer insulating layer 28 and the top surface of the second interlayer insulating layer 32 may undergo hydrophilic treatment by using a cleaning solution. Subsequently, the first interlayer insulating layer 28 and the second interlayer insulating layer 32 may be bonded to each other in a vacuum with a second surface ② of the second substrate 30 facing upwards.

Figure 2D:
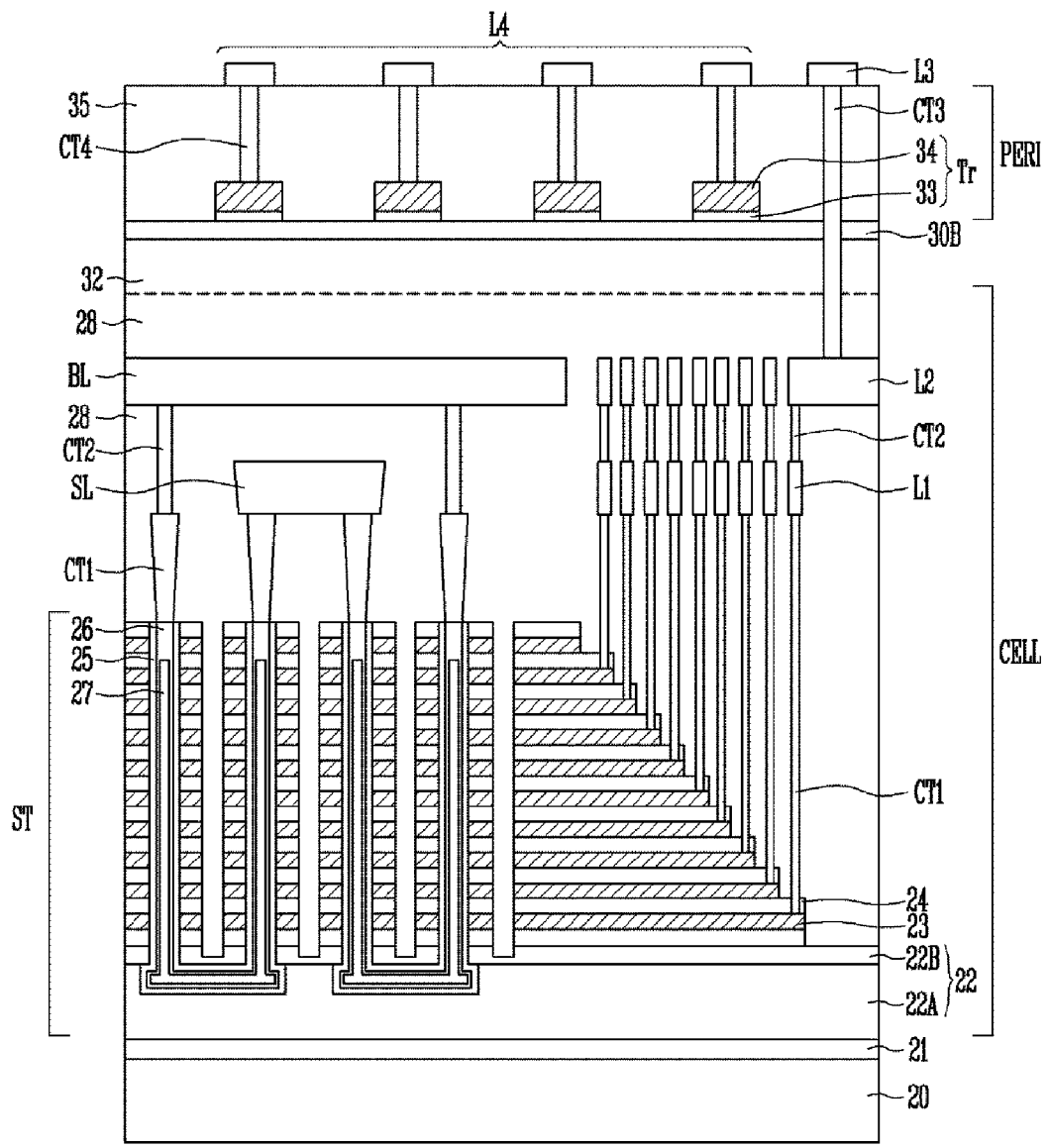

As illustrated in FIG. 2D, the lower part 30A of the second substrate 30 is removed. For example, when a bonded resultant structure is subject to heat treatment, the upper part 30B and the lower part 30A of the second substrate 30 are separated from each other at the boundary of the impurity layer 31. The lower part 30A of the second substrate 30 removed from the resultant structure may be reused.

In an alternate embodiment, the impurity layer 31 (FIG. 2B) is not formed. Instead, after the second interlayer insulating layer 32 is formed on the first surface ① of the second substrate 30, the top surface of the first interlayer insulating layer 28 and the top surface of the second interlayer insulating layer 32 may be bonded to each other. The rear surface ② of the second substrate 30 may be planarized by using Chemical Mechanical polishing (CMP) so that a portion of the second substrate 30 may remain.

One or more transistors Tr are formed on the remaining portion 30B of the second substrate 30. Each transistor Tr includes a gate insulating layer 33 formed on the portion 30B of the second substrate 30 and a gate electrode 34 formed on the gate insulating layer 33. The process steps for forming other elements of the transistors (such as source and drain regions in the case of MOS transistors) are well known in this art and thus will not be described.

A third interlayer insulating layer 35 is formed on the portion 30B of the second substrate 30 on which the transistors Tr are formed. The third interlayer insulating layer 35, the portion 30 of the second substrate 30B, the second interlayer insulating layer 32 and the first interlayer insulating layer 28 are etched to form third contact holes through which the second lines L2 are exposed. Other similar contact holes exposing bitlines BL may be formed at the same time. The third contact holes are filled with conductive layers to form third contact plugs CT3. The third interlayer insulating layer 35 is etched to form fourth contact holes through which the gate electrodes 34 of the transistors Tr are exposed. The fourth contact holes are filled with conductive layers to form fourth contact plugs CT4.

Subsequently, third lines L3 and fourth lines L4 are formed such that the third and fourth lines L3 and L4 may be coupled to the third and fourth contact plugs CT3 and CT4, respectively.

According to the above-described manufacturing method, after a memory cell forming process that requires a high temperature process is performed, transistors in the peripheral region PERI are formed. Therefore, when memory cells are formed, process temperature is advantageously not limited.

Figure 3:
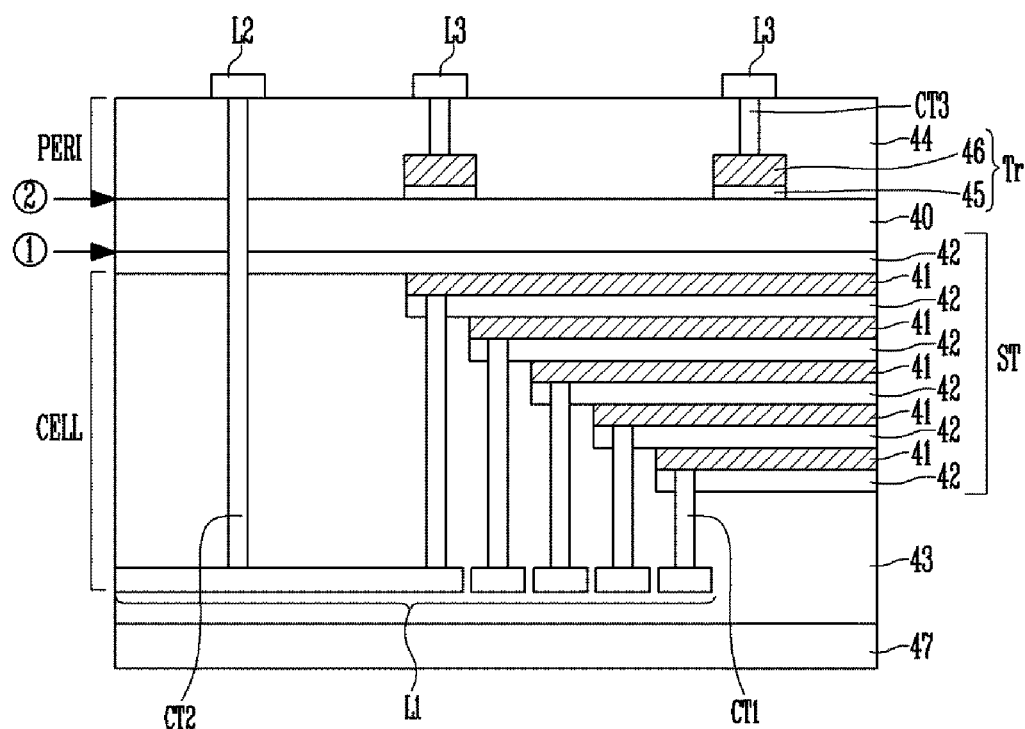
FIG. 3 is a cross-sectional view of a structure of a semiconductor device according to a second embodiment of the present invention.

FIG. 3 is a cross-sectional view of a structure of a semiconductor device according to a second embodiment of the present invention. A description of those aspects of the second embodiment that are the same as the first embodiment is omitted.

As illustrated in FIG. 3, the semiconductor device according to the second embodiment includes a first substrate 40, a second substrate 47 and at least one line, e.g., a second line L2. The first substrate 40 includes a cell region CELL formed along a first surface ① and a peripheral region PERI formed along a second surface ② thereof. The second substrate 47 is formed under the cell region CELL, and the second line L2 is formed in the peripheral region PERI. The second line L2 extends through the first substrate 40 and is coupled to the cell region CELL. The first surface ① may be a rear surface of the first substrate 40, and the second surface ② may be a top surface of the first substrate 40.

In addition, the semiconductor device may further include a stacked structure ST, a first interlayer insulating layer 43, a second interlayer insulating layer 44 and one or more transistors Tr. The stacked structure ST includes one or more first material layers 41 and one or more second material layers that are formed along the first surface ① of the first substrate 40 and are alternately stacked. The first interlayer insulating layer 43 covers the stacked structure ST and is interposed between the first substrate 40 and the second substrate 47. The second interlayer insulating layer 44 covers the transistors Tr and is formed on the second surface ② of the first substrate 40. The transistors Tr are formed along the second surface ② of the first substrate 40.

The stacked structure ST may have a top surface contacting the first surface ① of the first substrate 40 and gradually decrease in width toward a bottom thereof. For example, the stacked structure ST may have an inverted stepped sidewall. Each transistor Tr includes a gate insulating layer 45 that is formed on the second surface ② of the first substrate 40 and a gate electrode 46 that is formed on the gate insulating layer 45.

The semiconductor device may further include first contact plugs CT1 and first lines L1. Each of the first contact plugs CT1 is coupled to a corresponding one of the first material layers 41 in a contact region of the stacked structure ST. In addition, the first lines L1 may be coupled to the stacked structure ST through the first contact plugs CT1 and are located under the first substrate 40.

The semiconductor device may further include second contact plugs CT2 and second lines L2. The second contact plugs CT2 extend through the first substrate 40 and are coupled to the first lines L1. In addition, the second lines L2 are coupled to the first lines L1 through the second contact plugs CT2 and are located above the first substrate 40.

The semiconductor device may further include third contact plugs CT3 and third lines L3. Each of the third contact plugs CT3 is coupled to a corresponding one of the gate electrodes 46 of the transistors Tr. In addition, the third lines L3 are coupled to the transistors Tr through the third contact plugs CT3 and are located above the first substrate 40.

According to the above-described structure, unlike conventional semiconductor memories where the peripheral and the cell regions are formed along the same surface of a substrate, the peripheral region is formed along the top surface of the first substrate 40, and the cell region is formed along the rear surface of the first substrate 40, so that a high degree of integration is achieved.

Figure 4A:
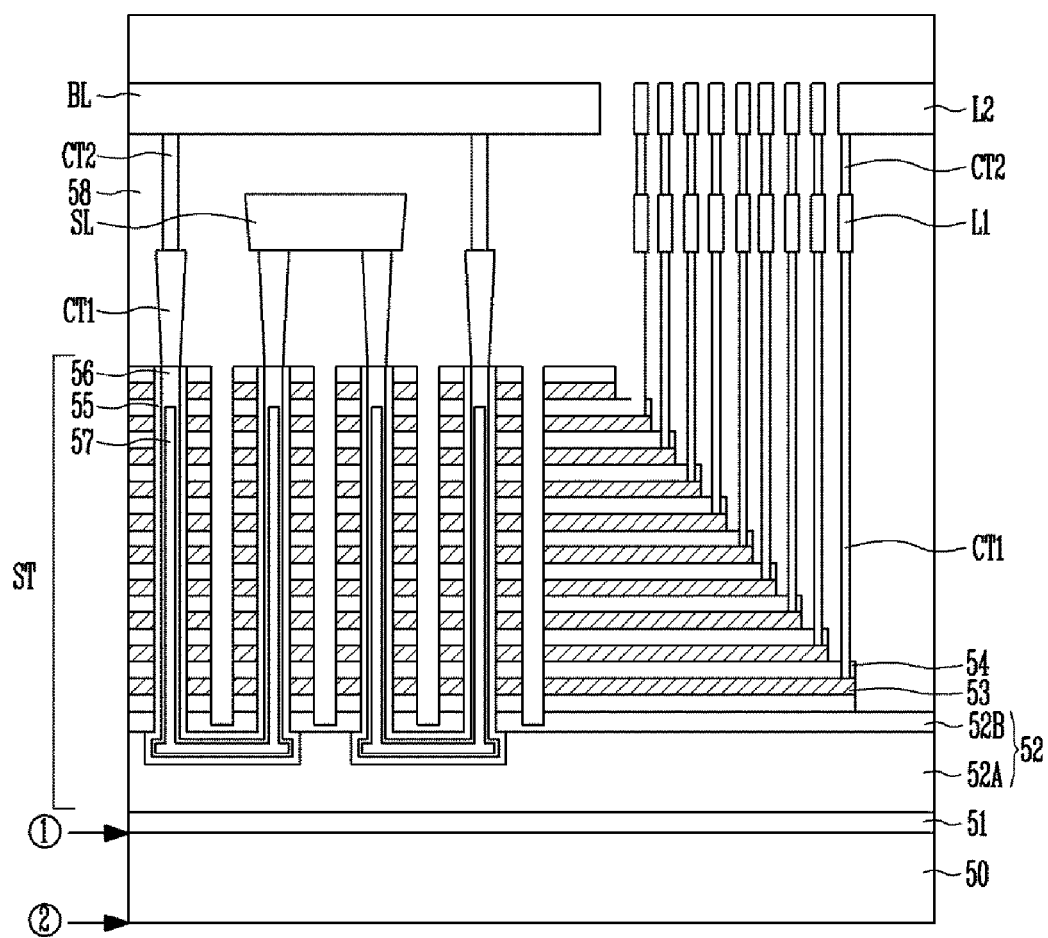
FIGS. 4A to 4C are cross-sectional views illustrating a process flow exemplifying a method of manufacturing a semiconductor device according to the second embodiment of the present invention.
Figure 4B:
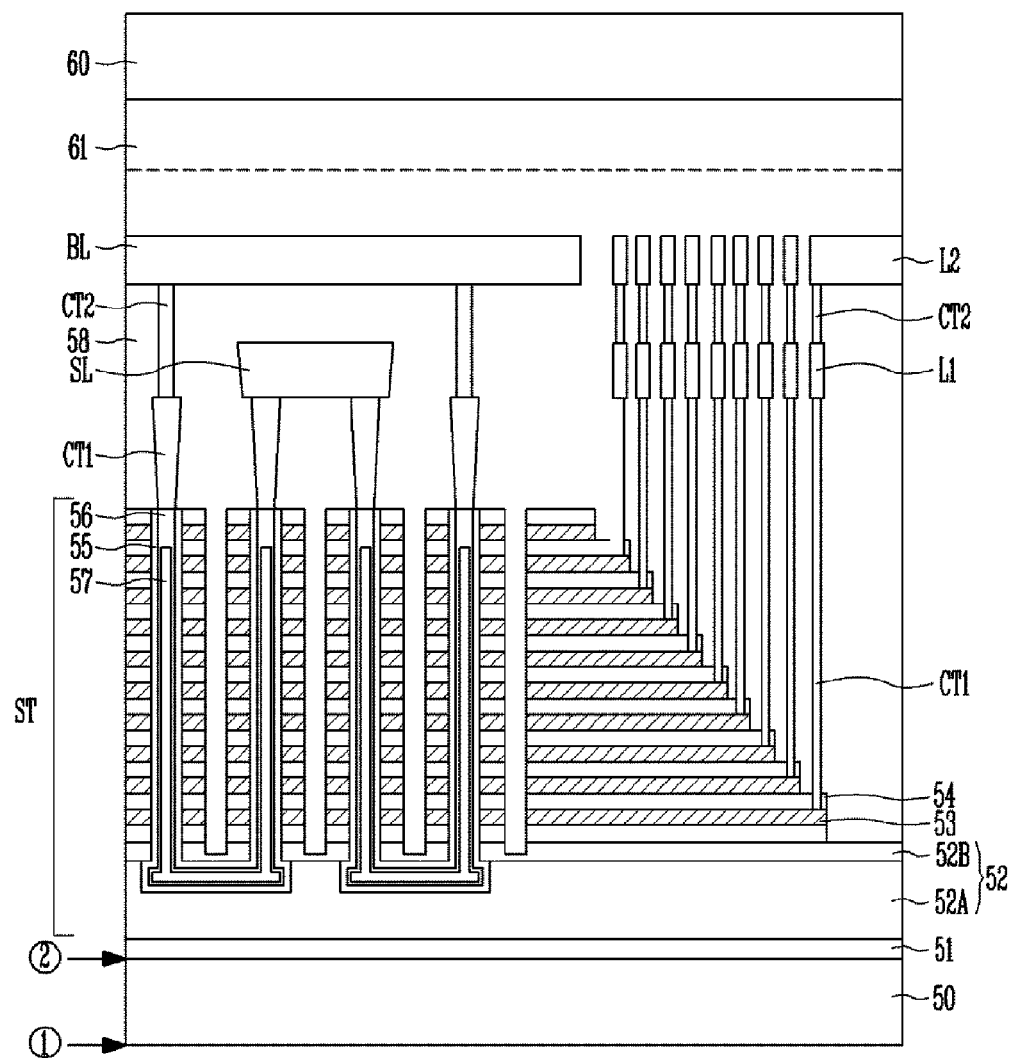
Figure 4C:
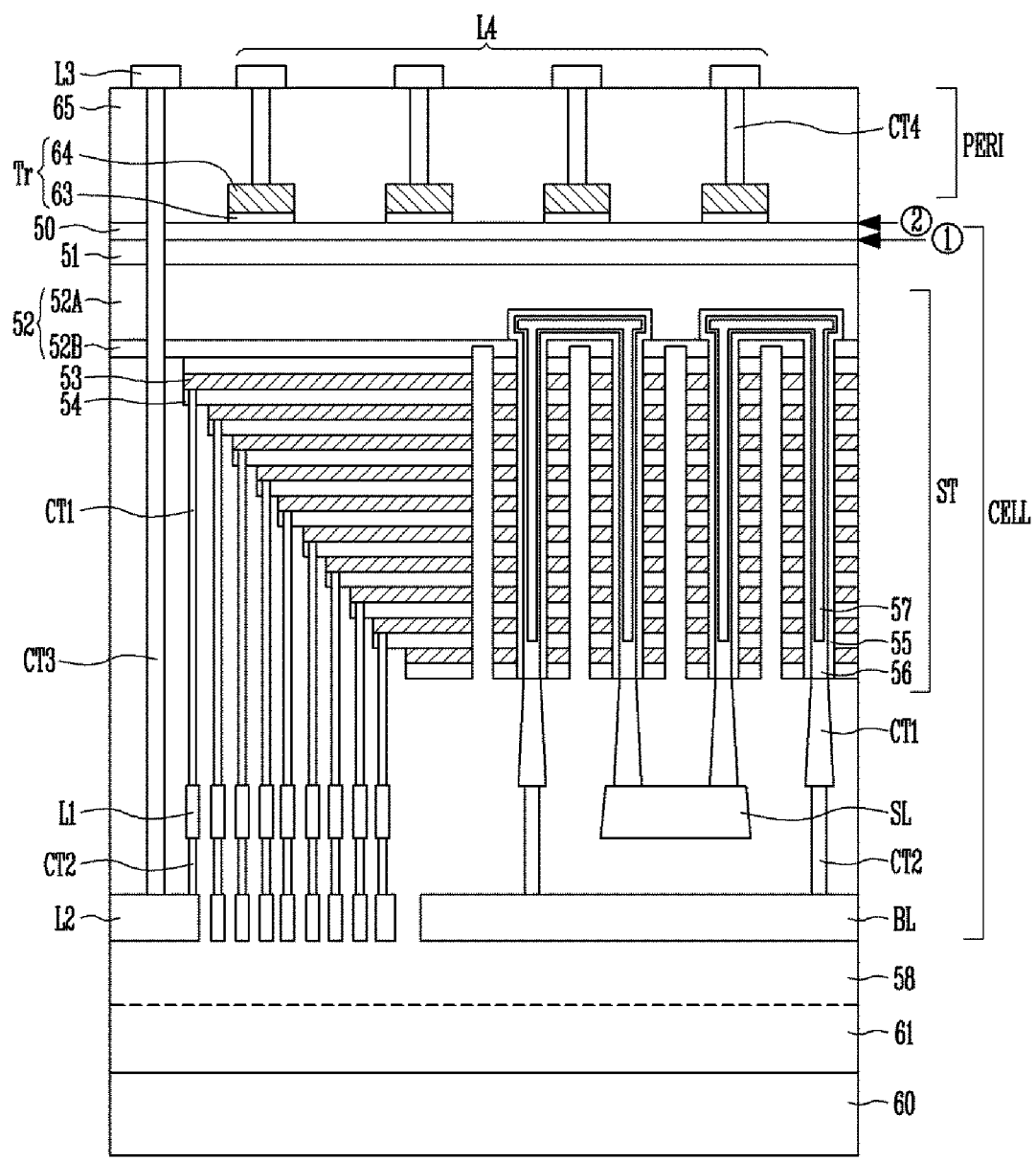

FIGS. 4A to 4C are cross-sectional views illustrating a process flow exemplifying a method of manufacturing a semiconductor device according to the second embodiment of the present invention. A description of the contents of the second embodiment, which are the same as those of the first embodiment, is omitted.

As illustrated in FIG. 4A, a stacked structure ST is formed along a first surface ① of a first substrate 50. For example, in FIG. 4A, the stacked structure ST includes U-shaped channel layers 56. The stacked structure ST further includes a pipe gate 52, one or more first material layers 53, and one or more second material layers 54. The pipe gate 52 is formed on the first substrate 50 with an insulating layer 51 interposed therebetween. The first material layers 53 and the second material layers 54 are alternately stacked over the pipe gate 52. The memory layers 55 surround the channel layers 56. A central region of each channel layer 56 may be filled with an insulating layer 57. The pipe gate 52 may include a first conductive layer 52A and a second conductive layer 52B.

Subsequently, a first interlayer insulating layer 58 that covers the stacked structure ST, and first contact plugs CT1, first lines L1, a source line SL, second contact plugs CT2, second lines L2 and bit lines BL that are coupled to the stacked structure ST are formed in a similar manner to that described in connection with FIG. 2A.

As illustrated in FIG. 4B, a second substrate 60 that includes a second interlayer insulating layer 61 formed thereon is prepared. A top surface of the first interlayer insulating layer 58 and a top surface of the second interlayer insulating layer 61 are bonded to each other along the dashed line in FIG. 4B. The second substrate 60 is used as a support.

As illustrated in FIG. 4C, a resultant structure is turned upside down with the first substrate 50 on top and the second substrate 60 on bottom. Subsequently, the second surface ② of the first substrate 50 is etched so that a portion of the first substrate 50 having a predetermined thickness may remain. As described above in connection with the first embodiment, a planarization process such as Chemical Mechanical polishing (CMP) may alternatively be used to remove a portion of the substrate 50.

Transistors Tr are formed along the second surface ② of the first substrate 50. Each transistor Tr includes a gate insulating layer 63 and a gate electrode 64.

A third interlayer insulating layer 65 is formed over the transistors Tr. The third interlayer insulating layer 65, the first substrate 50, the insulating layer 51, the pipe gate 52 and the first interlayer insulating layer 58 are etched to form third contact holes through which the second lines L2 are exposed. The third contact holes are filled with conductive layers to form third contact plugs CT3. In addition, the third interlayer insulating layer 65 is etched to form fourth contact holes through which gate electrodes 64 of the transistors Tr are exposed. The fourth contact holes are filled with conductive layers to form fourth contact plugs CT4.

Subsequently, third lines L3 and fourth lines L4 are formed so that the third and fourth lines L3 and L4 may be coupled to the third and fourth contact plugs CT3 and CT4, respectively.

According to the above-described manufacturing method, after a memory cell forming process that requires a high temperature process is performed, transistors are formed in the peripheral region PERI. Therefore, when memory cells are formed, process temperature is advantageously not limited.

FIGS. 5A to 5D are perspective views of structures of stacked structures according to various embodiments of the present invention. Various insulating layers isolating different regions and layers from one another are not shown in order to simplify the drawings.

Figure 5A:
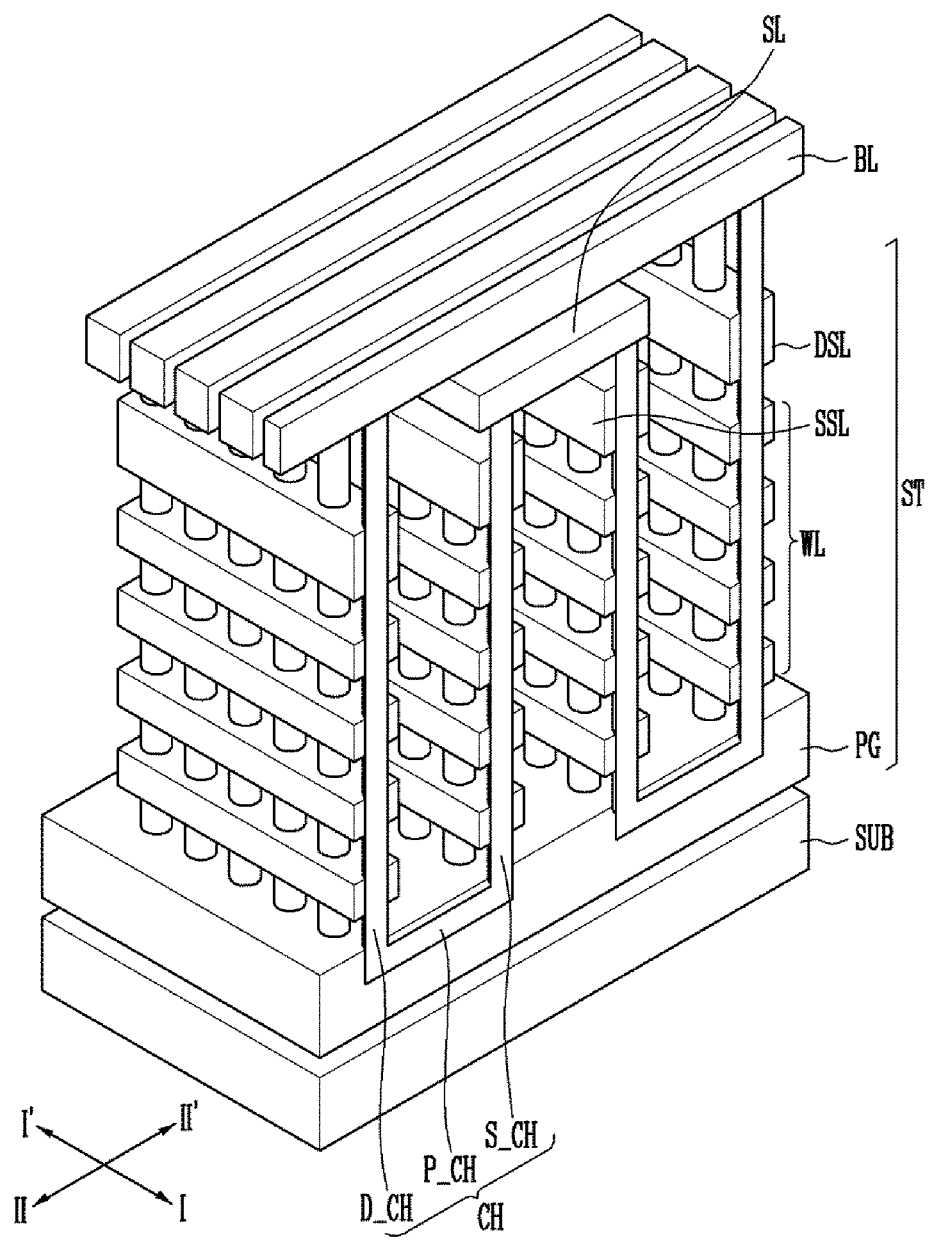
FIGS. 5A to 5D are perspective views of stacked structures according to various embodiments of the present invention.

FIG. 5A illustrates a stacked structure with U-shaped channel layers and memory cells.

As illustrated in FIG. 5A, the stacked structure ST may include a pipe gate PG, word lines WL, drain selection lines DSL and source selection lines SSL that are stacked over a substrate SUB. The word lines WL and the drain and source selection lines DSL and SSL may have linear shapes extending in a first direction I-I'.

The stacked structure ST may further include channel layers CH that have a U shape and may be positioned along the first direction I-I' and along the second direction II-II' that is perpendicular to the first direction I-I'. Each channel layer CH may include a pipe channel layer portion P_CH that may be formed in the pipe gate PG and may laterally extend along the I-I' direction. Each channel layer CH may also include vertically extending source-side and drain-side channel layer portions S_CH and D_CH that are coupled to the pipe channel layer portion P_CH.

In addition, the stacked structure ST may further include memory layers (not illustrated) interposed between the U-shaped channel layers CH and word lines WL. Each memory layer may include a tunnel insulating layer, a charge storing layer and a charge blocking layer. In addition, the charge storing layer may include a trap layer such as a nitride layer, a floating gate formed of a polysilicon layer or the like, or nanodots.

The stacked structure ST is coupled to source lines SL and bit lines BL. For example, the source-side channel layer portions S_CH are coupled to the source line SL extending along the first direction I-I', and the drain-side channel layer portions D_CH are coupled to the bit lines BL extending along the second direction II-II'.

According to the above-described structure, drain selection transistors DST are formed at the intersections of the channel layers CH and the drain selection lines DSL, source selection transistors SST are formed at the intersections between the channel layers CH and the source selection lines SSL, and memory cells MC are formed at the intersections between the channel layers CH and the word lines WL.

In addition, at least one drain selection transistor, a number of memory cells, and at least one source selection transistor that are coupled in series with each other form a memory string. A number of memory strings each having a U shape are thus formed.

Though not illustrated in FIG. 5A, end portions of the word lines WL, the drain selection lines DSL and the source selection lines SSL form a stepped sidewall. A contact region is defined along the stepped sidewall of the stacked structure ST where the word lines WL, the drain selection lines DSL and the source selection lines SSL are contacted by interconnect lines.

Figure 5B:
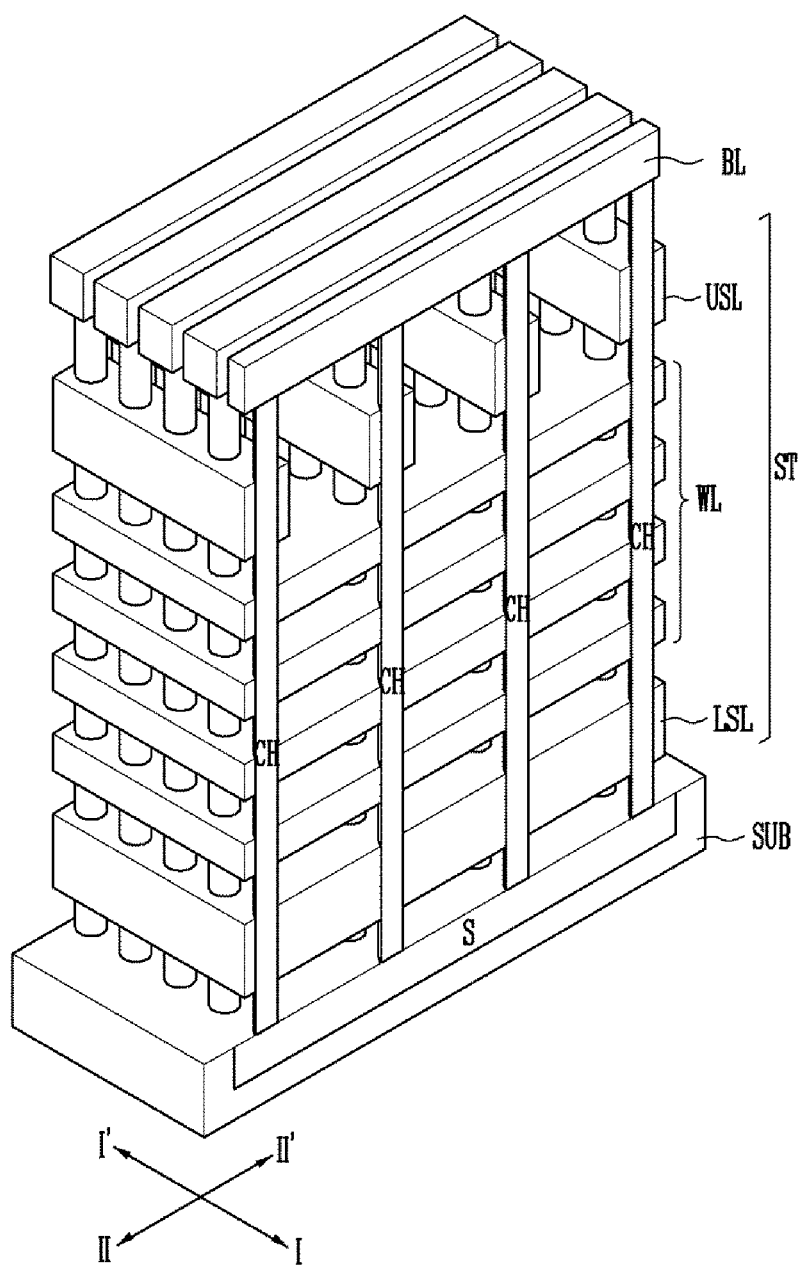

FIG. 5B illustrates a stacked structure with vertically extending channel layers and memory cells.

As illustrated in FIG. 5B, the stacked structure ST may include a lower selection line LSL, word lines WL and upper selection lines USL that may be sequentially stacked over a substrate SUB in which a source region S may be formed. The lower selection line LSL and the word lines WL may be shaped like plates. The upper selection lines USL may have linear shapes extending along the first direction I-I'.

The stacked structure ST may further include vertical channel layers CH arranged along both the first direction I-I' and the second direction II-II'. The vertical channel layers CH may be coupled at a lower end to the source region in the substrate SUB, and extend through the lower selection line LSL, the word lines WL and the upper selection lines USL. In addition, the stacked structure ST includes memory layers (not illustrated) interposed between the vertical channel layers CH and the word lines WL.

The stacked structure ST may be coupled to bit lines BL. For example, the channel layers CH may be coupled at an upper end to the bit lines BL extending along the second direction II-II'.

According to the above-described structure, at least one lower selection transistor, memory cells located directly above the lower selection transistor, and at least one upper selection transistor that are coupled in series with each other along the vertical dimension form a single vertical memory string.

Figure 5C:
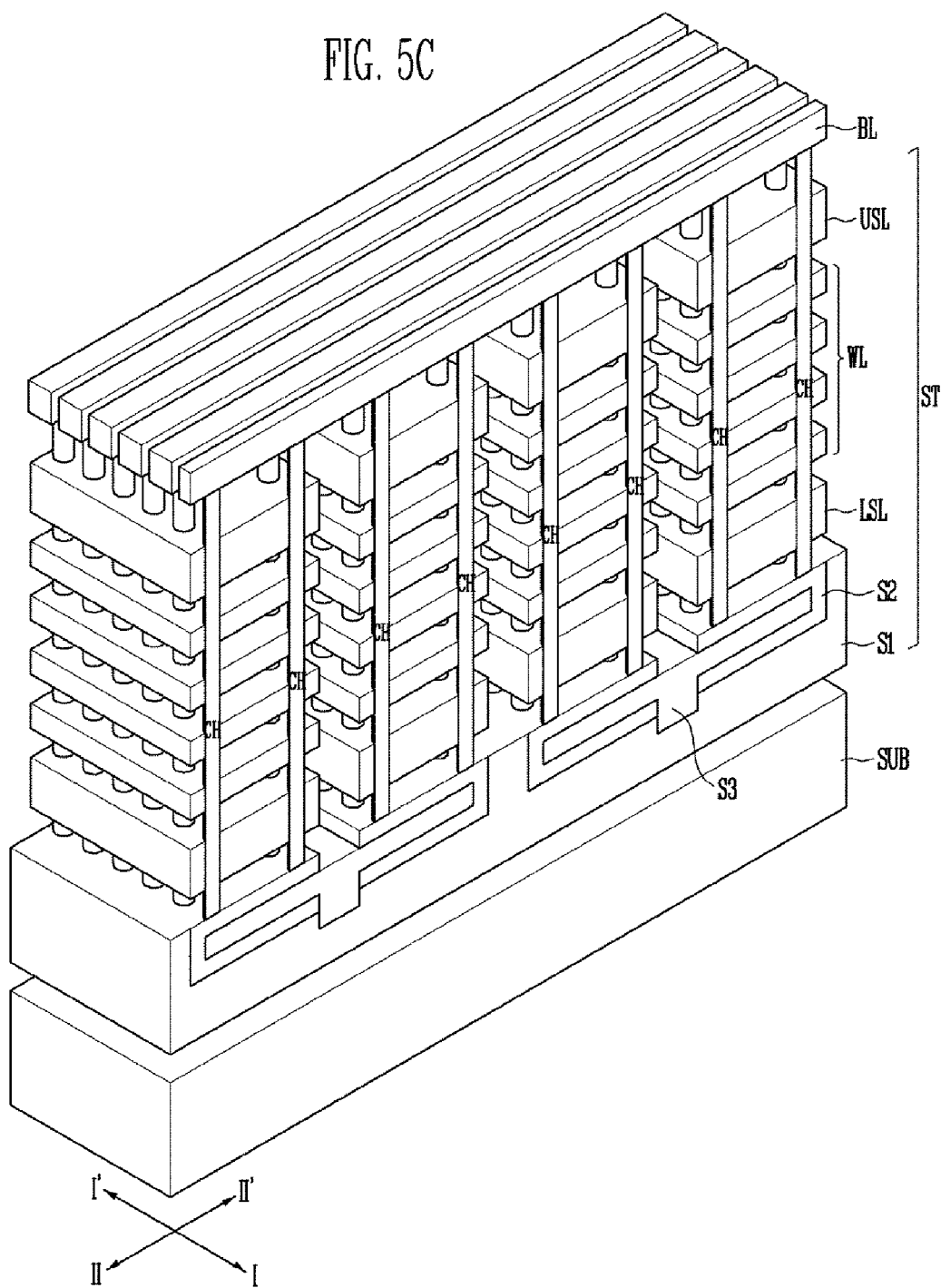

FIG. 5C illustrates a stacked structure with vertical channel layers and memory cells.

As illustrated in FIG. 5C, a stacked structure ST may include source layers S1 to S3, lower selection lines LSL, word lines WL and upper selection lines USL that may be sequentially stacked. The source layers S1 to S3 may include a first source layer S1 formed over a substrate SUB, one or more second source layer S2 formed in the first source layer S1, and third source layers S3 formed in the second source layers S2. The third source layers S3 may penetrate the second source layers S2 to couple to the first source layer S1. Thus, the first to third source layers S1 to S3 are connected to each other and function as a single source layer. For example, each of the first and second source layers S1 and S2 may include a polysilicon layer, and the third source layer S3 may include a metal layer. In this case, the third source layer S3 having a relatively small resistance may act as a main source layer, so that source resistance may be reduced.

The stacked structure ST may further include vertically extending channel layers CH arranged in both the first direction I-I' and the second direction II-II'. The vertical channel layers CH may be formed integrally with the second source layer S2. In addition, the vertical channel layers CH may be coupled at a lower end to the second source layer S2 and extend vertically through the lower selection line LSL, the word lines WL and the upper selection line USL. In addition, the stacked structure ST may further include memory layers (not illustrated) that surround outer surfaces of the vertical channel layers CH and the second source layer S2.

The stacked structure ST may be coupled to bit lines BL. For example, the vertical channel layers CH may be coupled at an upper end to the bit lines BL extending along the second direction II-II'.

According to the above-described structure, at least one lower selection transistor, memory cells located directly above the lower selection transistor, and at least one upper selection transistor that are coupled in series with each other along the vertical dimension form a single vertical memory string.

Figure 5D:
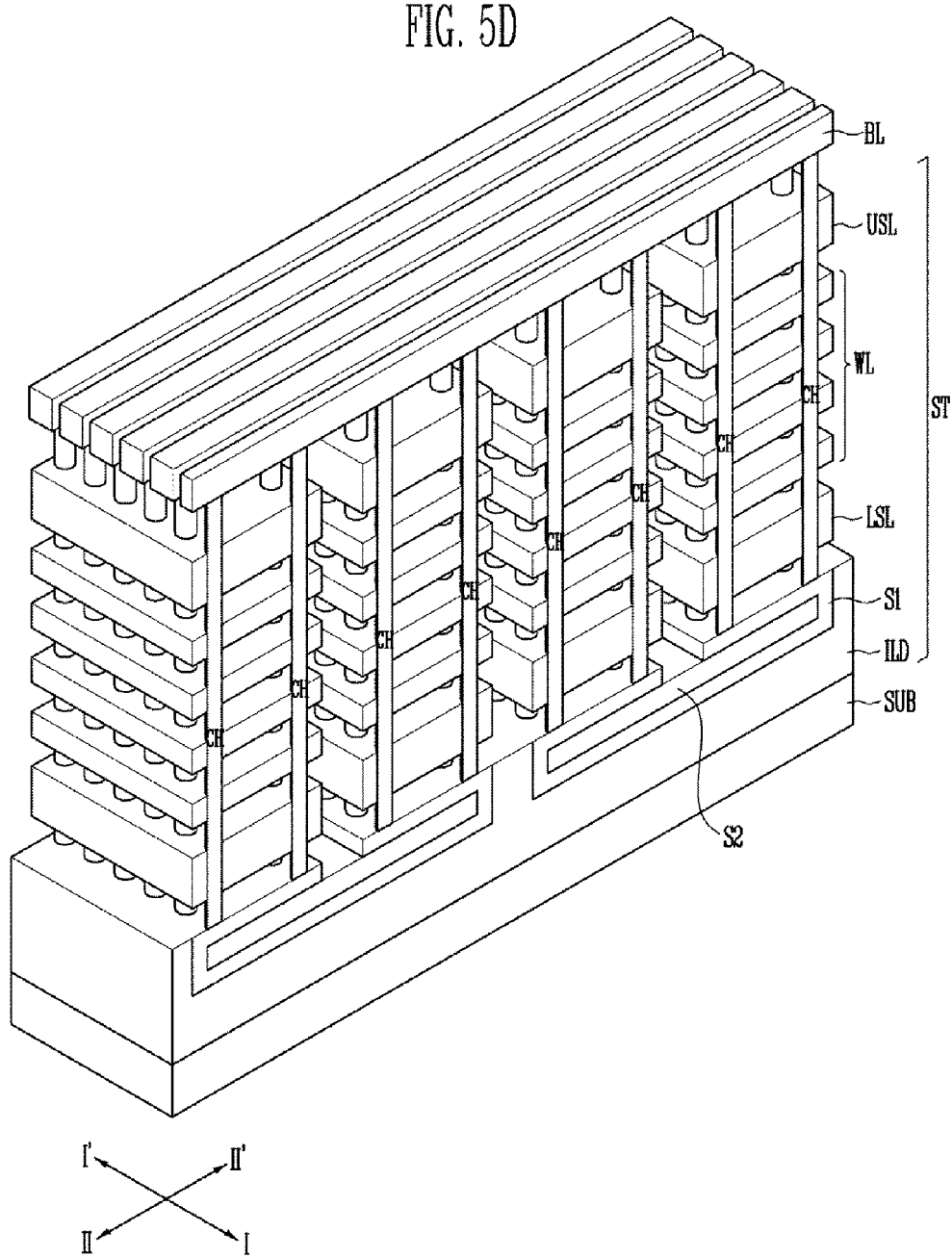

FIG. 5D illustrates a stacked structure with vertical channel layers and memory cells.

As illustrated in FIG. 5D, a stacked structure ST may include an interlayer insulating layer ILD, lower selection lines LSL, word lines WL and upper selection lines USL that are sequentially stacked. The stacked structure ST may include one or more first source layers S1 formed in the interlayer insulating layer ILD and second source layers S2 formed in the first source layers S1. Thus, the first and second source layers S1 and S2 are connected to each other and function as a single source layer. For example, the first source layer S1 may include a polysilicon layer, and the second source layer S2 may include a metal layer. In this case, the second source layer S2 having a relatively small resistance may act as a main source layer, so that source resistance may be reduced.

The stacked structure ST may further include vertical channel layers CH that are arranged along both the first direction I-I' and the second direction II-II'. The vertical channel layers CH may couple at a lower end to the first source layer S1 and vertically extend through the lower selection lines LSL, the word lines WL and the upper selection lines USL. In addition, the stacked structure ST may further include memory layers (not illustrated) that surround outer surfaces of the channel layers CH and the first source layers S1.

The stacked structure ST may be coupled to the bit lines BL. For example, the vertical channel layers CH may be coupled at an upper end to the bit lines BL extending along the second direction II-II'.

In FIG. 5D, the first source layer S1 completely surrounds a bottom surface of the second source layer S2. However, a portion of the bottom surface of the second source layer S2 may protrude through the first source layer S1.

According to the above-described structure, at least one lower selection transistor, memory cells located directly above the lower selection transistor, and at least one upper selection transistor that are coupled in series with each other along the vertical dimension form a single vertical memory string.

FIGS. 6A to 6E are cross-sectional views of various cell structures that can be integrated with the semiconductor devices according to the embodiments of the present invention described above.

Figure 6A:
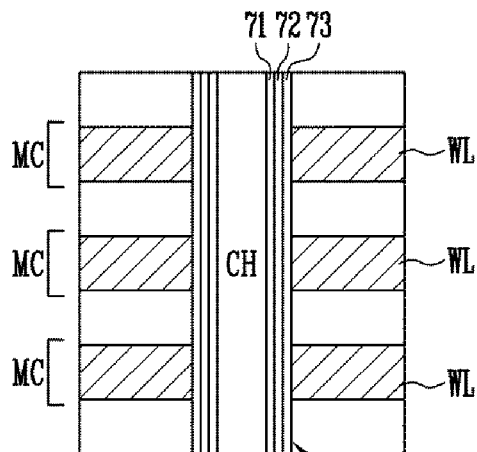
FIGS. 6A to 6E are cross-sectional views of memory cell structures that can be integrated with the semiconductor devices according to various embodiments of the present invention.

As illustrated in FIG. 6A, memory cells MC include a vertical channel layer CH, a tunnel insulating layer 71 surrounding the vertical channel layer CH, a charge storing layer 72 surrounding the tunnel insulating layer 71 and a charge blocking layer 73 surrounding the charge storing layer 72. The charge storing layer 72 may include a polysilicon layer that can store and emit charge, a nitride layer that can trap and emit charge, and/or nanodots.

A method of manufacturing the memory cell MC in FIG. 4A is described in brief. One or more sacrificial layers and one or more interlayer insulating layers are alternately formed. The sacrificial layers and the interlayer insulating layers are etched to form a channel hole H. The charge blocking layer 73, the charge storing layer 72 and the tunnel insulating layer 71 are formed along the inner surfaces of the channel hole H. Subsequently, a vertical channel layer CH is formed in the channel hole H. The sacrificial layers and the interlayer insulating layers are partially etched to form at least one slit (not illustrated). The sacrificial layers exposed through the slit are etched to form first recessed regions. The first recessed regions are filled with conductive layers to form word lines WL.

In an alternate embodiment, according to the structure illustrated in FIG. 5B, the charge blocking layer 73, the charge storing layer 72 and the tunnel insulating layer 71 formed along the bottom of the channel hole H are etched to expose the source region S on the bottom of the channel hole H. Subsequently, the vertical channel layer CH is formed in the channel hole H. Here, a protective layer (not illustrated) may be additionally formed on the vertically-extending portions of the tunnel insulating layer 71 before removing layers 71, 72, 73 from the bottom of the channel hole H. The protective layer may protect the tunnel insulating layer 71 from damage during the process of etching the charge blocking layer 73, the charge storing layer 72 and the tunnel insulating layer 71 from the bottom of the channel hole H. In addition, FIG. 6A illustrates that the channel hole H is completely filled with the vertical channel layer CH. However, the vertical channel layer CH may have a tubular shape with an open central portion that may be filled with an insulating layer. In the embodiment with U-shaped channel layers CH (e.g., FIG. 2A), the charge blocking layer 73, the charge storing layer 72 and the tunnel insulating layer 71 formed along inner surfaces of the vertical channel holes and the lateral pipe holes may be left intact prior to forming the channel layer CH in the vertical channel holes and the pipe channel holes.

Figure 6B:
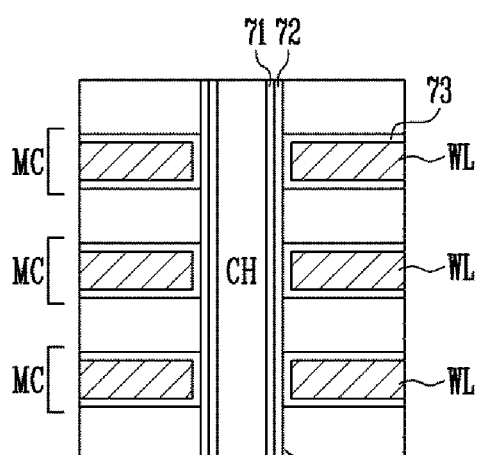

One or more conductive layers and one or more sacrificial layers may be alternately formed instead of the sacrificial layers and the interlayer insulating layers. In this case, after the slit is formed, the conductive layers exposed through the slit may be silicided. As illustrated in FIG. 6B, the memory cells MC include the vertical channel layer CH, the tunnel insulating layer 71 surrounding the vertical channel layer CH, the charge storing layer 72 surrounding the tunnel insulating layer 71 and charge blocking layers 73. The charge blocking layers 73 are interposed between the charge storing layer 72 and word lines WL. In addition, each of the charge blocking layers 73 surrounds top and bottom surfaces of a corresponding one of the word lines WL.

A method of manufacturing the memory cell MC in FIG. 6B is described in brief. One or more sacrificial layers and one or more interlayer insulating layers that are alternately stacked are etched to form the channel hole H. The charge storing layer 72 and the tunnel insulating layer 71 are formed along the inner surfaces of the channel hole H. The vertical channel layer CH is formed on the tunnel insulating layer 71. The sacrificial layers and the interlayer insulating layers are partially etched to form at least one slit. The sacrificial layers exposed through the slit are etched to form first recessed regions. Subsequently, charge blocking layers 73 are formed along inner surfaces of the first recessed regions, and then the word lines WL are formed in the first recessed regions by filling the first recessed regions with conductive layers.

In an alternate embodiment, a first charge blocking layer (not illustrated), the charge storing layer 72 and the tunnel insulating layer 71 may be formed along the inner surfaces of the hole H before the vertical channel layer CH is formed, and a second charge blocking layer 73 may be formed along inner surfaces of the first recessed regions before the word lines WL are formed. In this case, before the second charge blocking layer 73 is formed, the first charge blocking layer exposed in the first recessed regions may be removed.

Figure 6C:
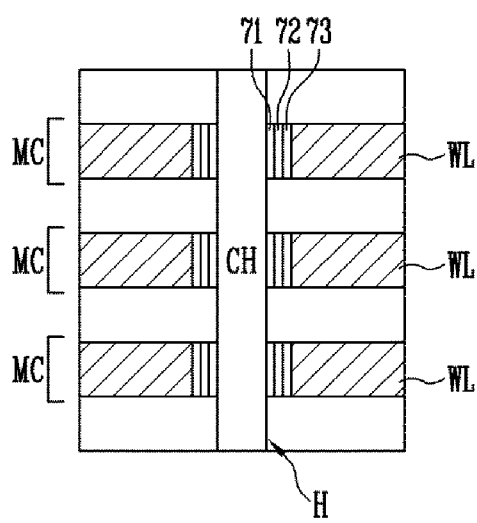

As illustrated in FIG. 6C, the memory cells MC include the vertical channel layer CH, the tunnel insulating layers 71 intermittently surrounding the vertical channel layer CH, charge storing layers 72 intermittently surrounding the tunnel insulating layers 71, and the charge blocking layers 73 intermittently surrounding the charge storing layers 72. The tunnel insulating layers 71, the charge storing layers 72 and the charge blocking layers 73 are interposed between the vertical channel layer CH and the word lines WL. Therefore, the charge storing layers 72 of the stacked memory cells MC are physically separated from each other, thereby preventing movement of charges between the memory cells MC.

A method of manufacturing the memory cell MC in FIG. 6C is described in brief. One or more conductive layers and one or more sacrificial layers are alternately formed. The alternately stacked conductive layers and sacrificial layers are etched to form the channel hole H. The charge blocking layer 73, the charge storing layer 72 and the tunnel insulating layer 71 are formed along the inner surfaces of the channel hole H. Subsequently, the vertical channel layer CH is formed in the hole H. The conductive layers and the sacrificial layers are etched to form at least one slit. The sacrificial layers exposed through the slit are etched to form second recessed regions. After the charge blocking layer 73, the charge storing layer 72 and the tunnel insulating layer 71 exposed in the second recessed regions are etched, insulating layers are formed in the second recessed regions.

Figure 6D:
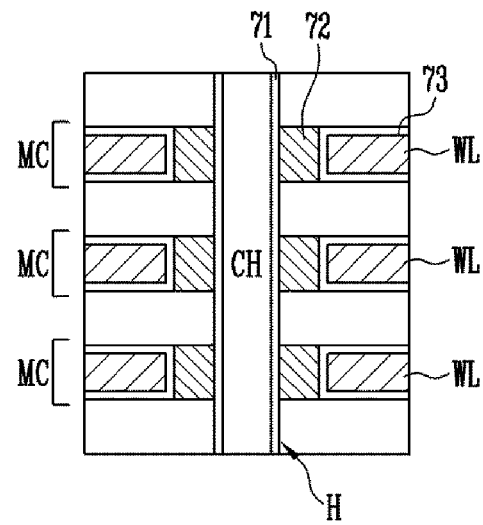

As illustrated in FIG. 6D, the memory cells MC include the vertical channel layer CH, the tunnel insulating layer 71 surrounding the vertical channel layer CH, the charge storing layers 72 and the charge blocking layers 73. The charge storing layers 72 intermittently surround the tunnel insulating layer 71 and are interposed between the tunnel insulating layer 71 and the word lines WL. The charge blocking layers 73 are interposed between the charge storing layers 72 and the word lines WL and surround top and bottom surfaces of the word lines WL. Therefore, the charge storing layers 72 of the memory cells MC are physically separated from each other, thereby preventing movement of charges between the memory cells MC.

A method of manufacturing the memory cell MC in FIG. 6D is described in brief. One or more sacrificial layers and one or more interlayer insulating layers that are alternately stacked are etched to form the channel hole H. The sacrificial layers exposed through the channel hole H are etched to form first recessed regions. The charge storing layers 72 are formed in the first recessed regions. After the tunnel insulating layer 71 is formed along the inner surfaces of the channel hole H, the vertical channel layer CH is formed thereon. The sacrificial layers and the interlayer insulating layers are etched to form at least one slit, and the sacrificial layers exposed through the slit are etched to form second recessed regions. After the charge blocking layers 73 are formed along inner surfaces of the second recessed regions, the word lines WL are formed in the second recessed regions by filling the second recessed regions with conductive layers. Therefore, the charge storing layers 72 of the stacked memory cells MC are physically separated from each other, thereby preventing movement of charges between the memory cells MC.

Figure 6E:
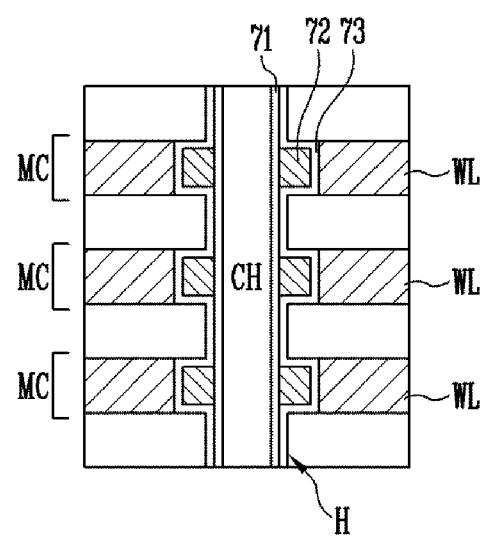

As illustrated in FIG. 6E, the memory cells MC include the vertical channel layer CH, the tunnel insulating layer 71 surrounding the vertical channel layer CH, the charge storing layers 72 and the charge blocking layer 73. The charge storing layers 72 intermittently surround the tunnel insulating layer 71 and are interposed between the tunnel insulating layer 71 and the word lines WL. The charge blocking layer 73 surround the charge storing layers 72 and the tunnel insulating layer 71. Therefore, the charge storing layers 72 of the memory cells MC are physically separated from each other, thereby preventing movement of charges between the memory cells MC.

A method of manufacturing the memory cell MC in FIG. 6E is described in brief. One or more sacrificial layers and one or more interlayer insulating layers that are alternately stacked are etched to form the channel hole H. The sacrificial layers exposed through the channel hole H are etched to form first recessed regions. The charge blocking layer 73 is formed along the inner surfaces of the channel hole H and the first recessed regions. Subsequently, the charge storing layers 72 are formed in the first recessed regions over the charge blocking layer 73. After the tunnel insulating layer 71 is formed along the inner surfaces of the channel hole H, the vertical channel layer CH is formed thereon. The sacrificial layers and the interlayer insulating layers are etched to form at least one slit. The sacrificial layers exposed through the slit are etched to form second recessed regions. The second recessed regions are filled with conductive layers to form the word lines WL. Therefore, the charge storing layers 72 of the stacked memory cells MC are physically separated from each other, thereby preventing movement of charges between the memory cells MC.

Figure 7A:
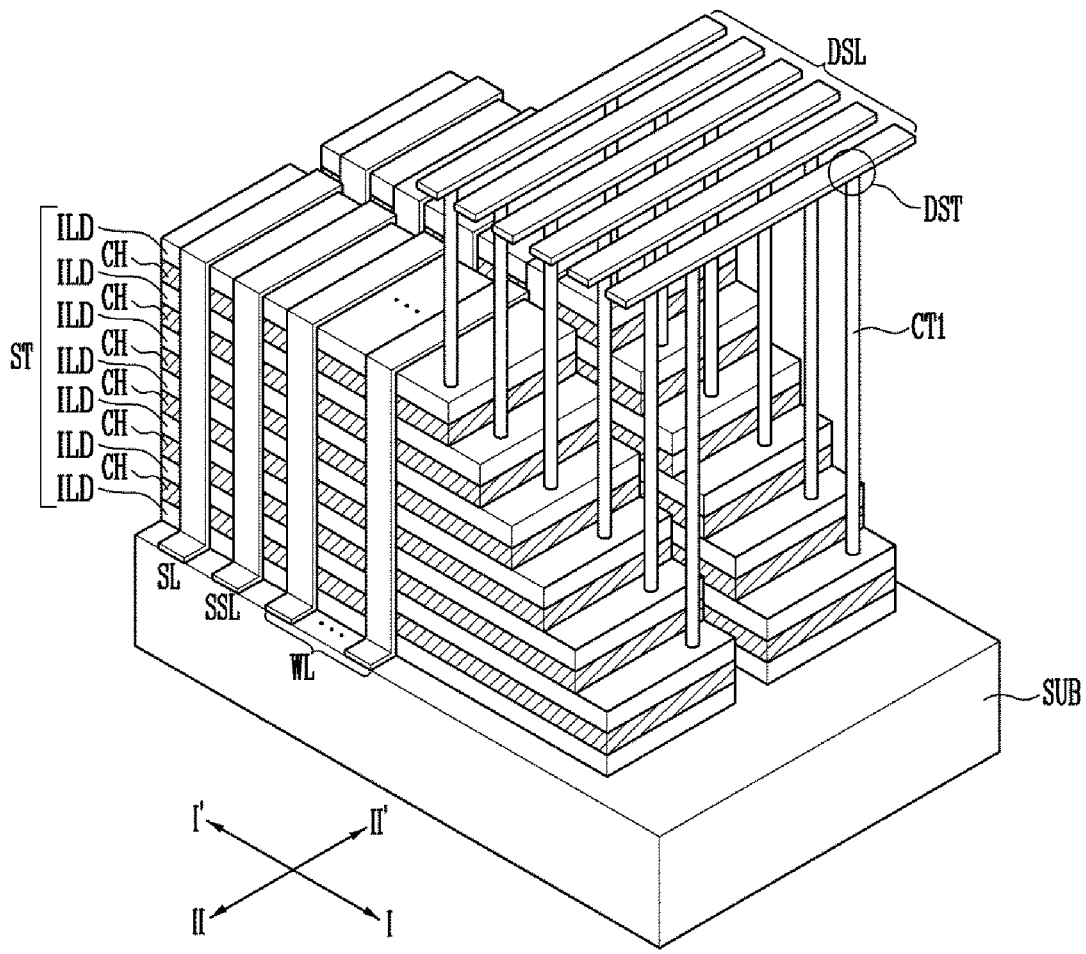
FIG. 7A is a perspective view of stacked structures according to an embodiment of the present invention.
Figure 7B:
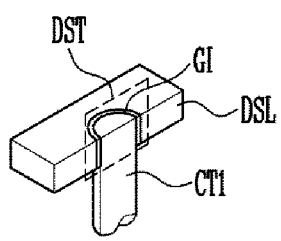
FIG. 7B is a cross-sectional views of drain selection transistor.

FIG. 7A is a perspective view of stacked structures according to an embodiment of the present invention, and FIG. 7B is a cross-sectional views of drain selection transistor. Specifically, FIGS. 7A and 7B illustrate stacked structures with horizontally extending channel layers and memory cells.

As illustrated in FIGS. 7A and 7B, stacked structures ST may have linear shapes extending along the first direction I-I' and may include horizontally extending channel layers CH and interlayer insulating layers ILD that are alternately stacked on top of one another. In addition, the stacked structures ST may further include conductive lines extending around the stacked structure ST. The conductive lines wrap around the sides of the stacked structures ST and extend along the second direction II-II'. In addition, the conductive lines extending around the stacked structure ST may include word lines WL, at least one source selection line SSL and at least one source line SL. The stacked structure ST may further include memory layers (not illustrated) that are interposed between the stacked structure and each of the word lines WL and the source selection lines SSL, while the source line SL makes direct contact with channel layers CH.

An end region of each stacked structure ST may have a stepped sidewall where a contact region is formed. First contact plugs CT1 may be formed in the contact region so that each contact plug CT1 may couple one of the horizontal channel layers CH to a corresponding one of the drain selection lines DSL.

According to the above-described structure, at least one drain selection transistor (formed at the intersection of one of the first contact plugs CT1 and a corresponding one of the drain selection lines DSL), memory cells associated with a corresponding channel layer CH, and at least one source selection transistor (formed where source selection line SSL crosses over the corresponding channel layer CH) form a single horizontal memory string. In addition, each drain selection transistor DST includes a gate insulating layer GI surrounding the channel layer and has a gate all-around structure (GAA) in which an entire surface of the channel layer is surrounded by a gate electrode.

A method of manufacturing the stacked structure ST and the conductive lines is described below in brief. One or more semiconductor layers and one or more interlayer insulating layers are alternately formed one on top of the other. The semiconductor layers and the interlayer insulating layers that are alternately formed are patterned and etched into linear shapes extending in one direction, so that multiple stacked structures are formed. Subsequently, memory layers are formed on entire surfaces of the multiple stacked structures, and conductive layers are formed on the memory layers. The conductive layers and the memory layers are then etched to form one or more conductive lines. The conductive lines wrap around the sides of the stacked structures with the memory layers interposed therebetween, and extend in the II-II' direction.

Figure 8A:
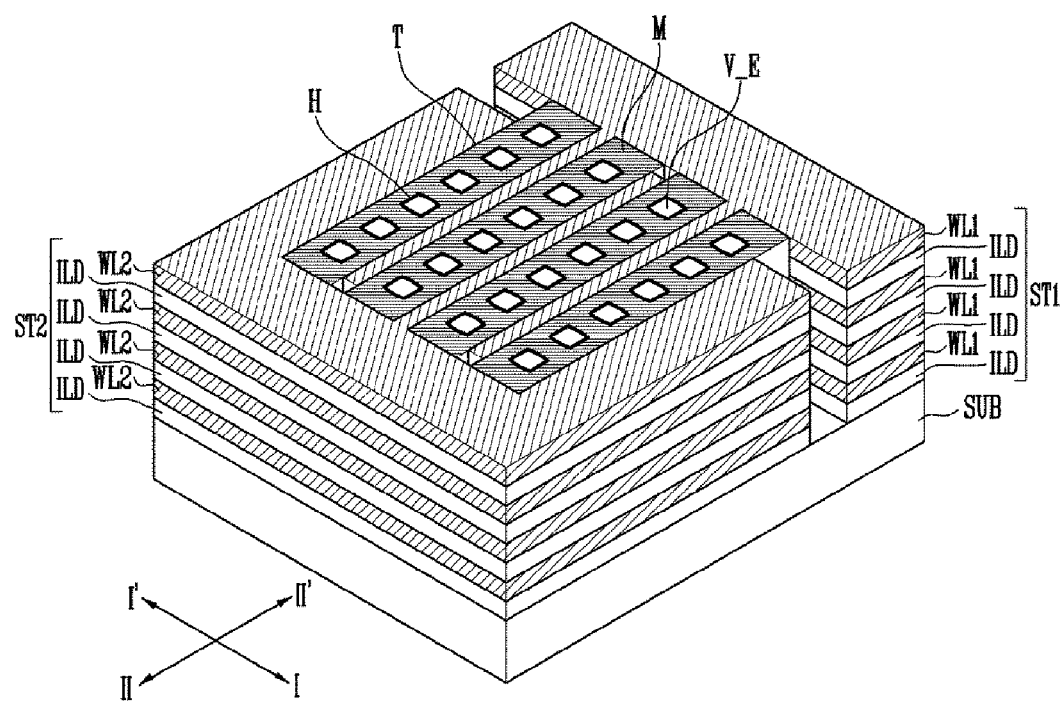
FIGS. 8A to 8C are perspective views of stacked structures according to an embodiment of the present invention.
Figure 8B:
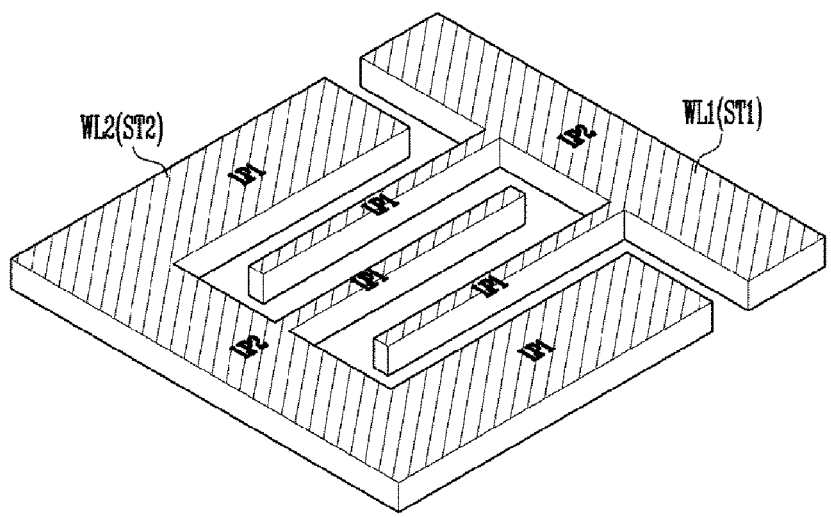
Figure 8C:
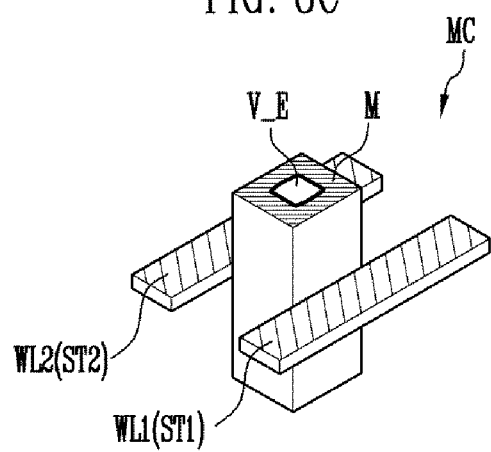

FIGS. 8A to 8C are perspective views of stacked structures according to an embodiment of the present invention. Specifically, FIGS. 8A to 8C illustrate a stacked structure with vertical electrode layers and memory cells.

As illustrated in FIGS. 8A and 8B, a first stacked structure ST1 includes one or more first word lines WL1 and one or more interlayer insulating layers ILD that are alternately stacked on top of one another over a substrate SUB. A second stacked structure ST2 includes one or more second word lines WL2 and one or more interlayer insulating layers ILD that are alternately stacked on top one another. In addition, vertical electrode layers V_E arranged along both the first direction I-I' and the second direction II-II' are located between the first and second stacked structures ST1 and ST2.

The first and second word lines WL1 and WL2 are of a finger-shaped word lines. In addition, each of the first and second word lines WL1 and WL2 includes first line patterns LP1 and second line pattern LP2. The first line patterns LP1 extend in the second direction II-II', and the second line patterns LP2 couple the first line patterns LP1 and extend in the first direction I-I'. In addition, the first line patterns LP1 of the first word line WL1 and the first line patterns LP1 of the second word line WL2 are alternately arranged. In addition, the vertical electrode layers V_E are located between the first line patterns LP1 of the first word line WL1 and the first line patterns LP1 of the second word line WL2 that are alternately arranged.

The first and second stacked structures ST1 and ST2 may further include memory layers M that surround the vertical electrode layers V_E. The memory layers M may be formed of variable resistance materials. For example, the variable resistance materials may include perovskite-based materials, chalcogenide-based materials, oxygen-deficient metal oxides, or metal sulfides. The perovskite-based materials may include SrTiO (STO) or PrCaMnO (PCMO). The chalcogenide-based materials may include GeSbTe (GST), GeSe, CuS, or AgGe. The transition metal oxides may include NiO, $TiO_2$, HfO, $Nb_2O_5$, ZnO, $ZrO_2$, $WO_3$, CoO, or $MnO_2$. The metal sulfides may include $Cu_2S$, CdS, or ZnS.

As illustrated in FIG. 8C, each memory cell MC includes the vertical electrode V_E, first and second word lines WL1 and WL2 extending in a direction crossing the vertical electrode V_E, and the memory layer M interposed between the vertical electrode V_E and the word lines WL1 and WL2. The vertical electrode V_E is located between the first word line WL1 and the second word line WL2. According to the above-described structure of the semiconductor device, a desired memory cell can be accessed by selecting one of the first and second word lines WL1 and WL2 on the same layer and selecting the vertical electrode V_E. In addition, the semiconductor device includes a plurality of memory cells stacked along the vertical electrode V_E.

A method of manufacturing the first and second stacked structures ST1 and ST2 is described below.

One or more conductive layers and one or more interlayer insulating layers are alternately formed one on top of the other over the substrate SUB. Subsequently, the conductive layers and the interlayer insulating layers are etched to form trenches T. After the memory layers M are formed in the trenches T, the memory layers M are etched to form one or more electrode holes H. Conductive layers are formed in the electrode holes H to form the vertical electrode layers V_E. The conductive layers and the interlayer insulating layers that are alternately stacked are etched to form finger-type first and second stacked structures ST1 and ST2.

Figure 9:
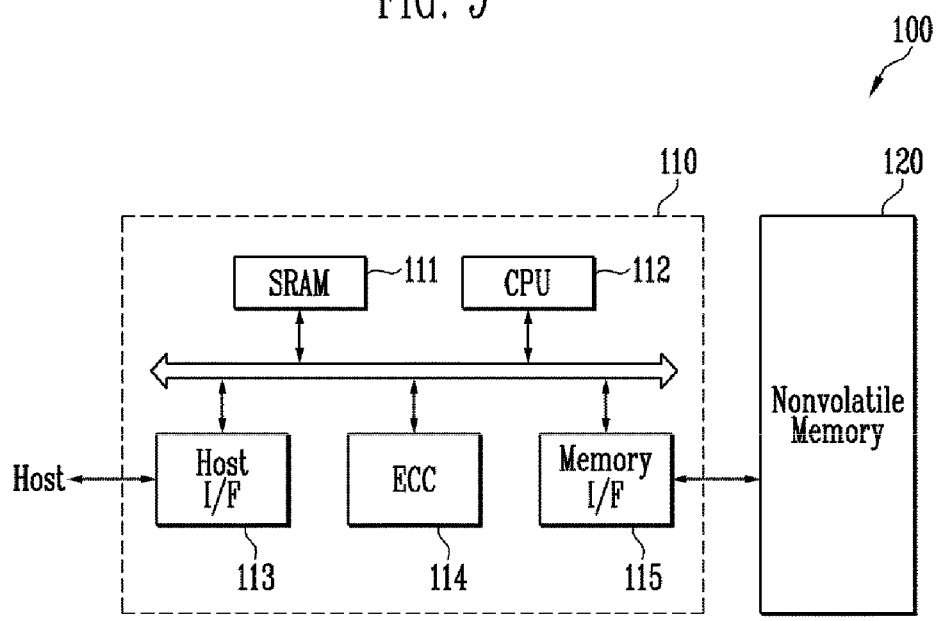
FIG. 9 is a block diagram showing the configuration of a memory system according to an embodiment of the present invention.

FIG. 9 is a block diagram showing the configuration of a memory system according to an embodiment of the present invention.

As illustrated in FIG. 9, a memory system 100 according to an embodiment of the present invention includes a non-volatile memory device 120 and a memory controller 110.

The non-volatile memory device 120 has the structure described above in the first to fifth embodiments. In addition, the non-volatile memory device 120 may be a multi-chip package composed of a plurality of flash memory chips.

The memory controller 110 is configured to control the non-volatile memory device 120. The memory controller 110 may include SRAM 111, a CPU 112, a host interface 113, an ECC 114 and a memory interface 115. The SRAM 111 functions as an operation memory of the CPU 112. The CPU 112 performs the general control operation for data exchange of the memory controller 110. The host interface 113 includes a data exchange protocol of a host being coupled to the memory system 100. In addition, the ECC 114 may detect and correct errors included in a data read from the non-volatile memory device 120. The memory interface 115 interfaces with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 10:
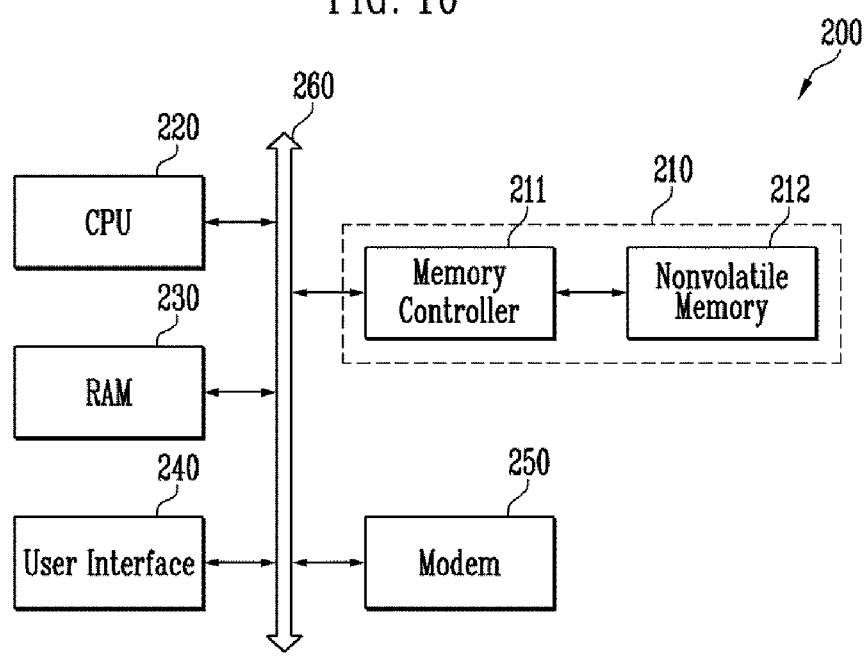
FIG. 10 is a block diagram showing the configuration of a computing system according to an embodiment of the present invention.

FIG. 10 is a block diagram showing the configuration of a computing system according to an embodiment of the present invention.

As illustrated in FIG. 10, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS) and mobile DRAM.

As described above with reference to FIG. 9, the memory system 210 may include a non-volatile memory 212 and a memory controller 211.

According to an embodiment of the present invention, a peripheral region is located above a cell region, so that a semiconductor device with a high degree of integration may be obtained. In addition, since transistors in the peripheral region is formed after a memory cell forming process that requires a high temperature process is performed, process temperature is not limited when memory cells are formed.

In this specification, various stacked structures have been described with reference to the accompanying drawings. However, they are provided for illustration purposes, and the invention is not limited thereto. The present invention is applicable to any semiconductor device including various stacked structures.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A semiconductor memory device, comprising:
   a first substrate on which a cell region is defined;
   a memory string located at the cell region and including at least one drain selection transistor, a number of memory cells, and at least one source selection transistor that are coupled in series with each other, wherein the memory cells are stacked on top of one another;
   first contact plugs coupled to the at least one drain selection transistor, the memory cells and the at least one source selection transistor;
   a first interlayer insulating layer located above the first substrate including the memory string;
   a second interlayer insulating layer located above the first interlayer insulating layer;
   a second substrate located above the second interlayer insulating layer, wherein a peripheral region is defined on the second substrate;
   first conductive lines coupled to the first contact plugs and located under the second substrate;
   second conductive lines located above the second substrate; and
   second contact plugs passing through the first interlayer insulating layer, the second interlayer insulating layer and the second substrate to couple the first conductive lines and the second conductive lines to each other.

2. The semiconductor device of claim 1, wherein the second conductive lines extend above the second substrate.

3. The semiconductor device of claim 1, further comprising:
   at least one transistor formed on the second substrate; and
   at least one third conductive line coupled to transistors formed in the peripheral region, wherein the at least one third conductive line is located above the second substrate.

4. The semiconductor device of claim 1, further comprising:
   a stacked structure formed in the cell region over the first substrate and including a plurality of first material layers and a plurality of second material layers stacked alternately on top of one another.

5. The semiconductor device of claim 4, wherein the plurality of first material layers comprises a conductive layer or a semiconductor layer, and the plurality of second material layers comprises an insulating layer.

6. The semiconductor device of claim 1, wherein the memory string comprises:
   a pipe gate located on the first substrate;
   word lines stacked on the pipe gate;
   drain selection lines and source selection lines stacked on the word lines; and
   channel layers, each including a pipe channel layer portion formed in the pipe gate and source-side and drain-side channel layer portions coupled to the pipe channel layer portion.

7. The semiconductor device of claim 1, wherein the memory string comprises:
   a first source layer located over the first substrate;
   one or more second source layers formed in the first source layer;
   third source layers formed in the second source layers and penetrating the second source layers to be coupled to the first source layer;

a source selection line, word lines and a drain selection line stacked on the first source layer including the second and third source layers; and channel layers coupled at a lower end to the second source layers and extending through the source selection line, the word lines and the drain selection line.

8. The semiconductor device of claim 1, wherein the memory string comprises:
   a third interlayer insulating layer located over the first substrate;
   one or more first source layers formed in the third interlayer insulating layer;
   second source layers formed in the first source layers and connected to the first source layers;
   a source selection line, word lines and a drain selection line stacked on the third interlayer insulating layer including the first and second source layers; and
   channel layers coupled at a lower end to the first source layer and extending through the lower selection line, the word lines and the upper selection line.

9. The semiconductor device of claim 1, wherein the memory string comprises:
   a first stacked structure including one or more first word lines and one or more third interlayer insulating layers that are alternately stacked on top of one another over the first substrate;
   a second stacked structure including one or more second word lines and one or more fourth interlayer insulating layers that are alternately stacked on top of one another; and
   vertical electrode layers located between the first and second stacked structures.

10. The semiconductor device of claim 9, wherein each of the first and second word lines comprises:
    first line patterns; and
    a second line pattern coupled to the first line patterns and crossing the first line patterns,
    wherein the first line patterns of the first word lines and the first line patterns of the second word lines are alternately arranged, so that the vertical electrode layers are located between the first line patterns of the first word lines and the first line patterns of the second word lines.

11. The semiconductor device of claim 1, wherein a top surface of the first interlayer insulating layer is hydrophilic treated and a bottom surface of the second interlayer insulating layer is hydrophilic treated, and
    wherein a bonded interface exists between the hydrophilic treated top surface of the first insulating layer and the hydrophilic treated bottom surface of the second interlayer insulating layer.

12. The semiconductor device of claim 1, wherein the first conductive lines are located within the first interlayer insulating layer.

13. A semiconductor memory device, comprising:
    a first substrate having a memory cell region in which a plurality of memory cells is disposed;
    a stacked structure formed in the memory cell region of the first substrate and including a plurality of first material layers and a plurality of second material layers stacked alternately on top of one another, wherein the stacked structure includes a stepped sidewall where a contact region is formed;
    a second substrate having a peripheral region, the peripheral region comprising circuitry configured to interface with the plurality of memory cells;
    an interlayer insulating layer interposed between the first substrate and the second substrate;
    first contact plugs coupled to the contact region of the first material layers;
    first conductive lines coupled to the first contact plugs, respectively, and located under the second substrate;
    second conductive lines located above the second substrate; and
    second contact plugs passing through the interlayer insulating layer and the second substrate to couple the first conductive lines and the second conductive lines to each other,
    wherein the first and second substrates are non-contiguous.

14. The semiconductor memory device of claim 13, wherein the first and second substrates are positioned at two different planes.

15. The semiconductor memory device of claim 13, wherein the memory cell region is formed along a top surface of the first substrate, the peripheral region is formed along a top surface of the second substrate, and the first and second substrates are coupled together with the second substrate located directly over the first substrate such that a bottom surface of the second substrate faces the top surface of the first substrate.

16. The semiconductor device of claim 13, wherein the plurality of first material layers comprises a conductive layer or a semiconductor layer, and the plurality of second material layers comprises an insulating layer.

17. The semiconductor device of claim 13, wherein the stacked structure comprises:
    channel layers and third interlayer insulating layers that are alternately stacked on top of one another; and
    word lines, at least one source selection line and at least one source line crossing the stacked structures and wrapped around the sides of the stacked structures,
    wherein each of the first contact plugs is coupled to each of the channel layers and the first conductive lines are drain selection lines coupled to the channel layers through the first contact plugs.

* * * * *